United States Patent
Baba et al.

(10) Patent No.: US 9,620,519 B2
(45) Date of Patent: Apr. 11, 2017

(54) NONVOLATILE SEMICONDUCTOR MEMORY DEVICE HAVING WORD LINE HOOKUP REGION WITH DUMMY WORD LINES

(71) Applicant: Kabushiki Kaisha Toshiba, Minato-ku (JP)

(72) Inventors: Yasuyuki Baba, Zama (JP); Kazuichi Komenaka, Yokohama (JP); Hirofumi Inoue, Kamakura (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/842,972

(22) Filed: Sep. 2, 2015

(65) Prior Publication Data

US 2016/0260722 A1    Sep. 8, 2016

Related U.S. Application Data

(60) Provisional application No. 62/128,205, filed on Mar. 4, 2015.

(51) Int. Cl.
    *H01L 29/792*     (2006.01)
    *H01L 21/336*     (2006.01)
    *H01L 27/11582*   (2017.01)
    *H01L 27/11573*   (2017.01)
    *H01L 27/11575*   (2017.01)

(52) U.S. Cl.
    CPC .. *H01L 27/11582* (2013.01); *H01L 27/11573* (2013.01); *H01L 27/11575* (2013.01)

(58) Field of Classification Search
    CPC ............ H01L 27/11517; H01L 29/788; H01L 29/792; H01L 2924/13081; H01L 2924/13085
    See application file for complete search history.

(56) References Cited

U.S. PATENT DOCUMENTS

| 2009/0097309 | A1  | 4/2009  | Mizukami et al. |
| 2011/0220987 | A1* | 9/2011  | Tanaka ............. H01L 27/11575 257/324 |
| 2012/0069655 | A1  | 3/2012  | Hishida et al. |
| 2014/0054787 | A1  | 2/2014  | Eun et al. |
| 2015/0279788 | A1* | 10/2015 | Uchiyama ............. G03F 9/7076 257/401 |

FOREIGN PATENT DOCUMENTS

| JP | 2009-88446  | 4/2009 |
| JP | 2012-69605  | 4/2012 |
| JP | 2014-42029  | 3/2014 |

* cited by examiner

*Primary Examiner* — Thomas L Dickey
*Assistant Examiner* — Damon Hillman
(74) *Attorney, Agent, or Firm* — Oblon, McClelland, Maier & Neustadt, L.L.P.

(57) ABSTRACT

According to one embodiment, a nonvolatile semiconductor memory device comprises a memory cell array including a first selection gate, word lines and a second selection gate stacked above a semiconductor substrate, and a memory pillar disposed through the first selection gate, word lines and second selection gate, a hookup region disposed adjacent to the memory cell array region in a first direction, and a dummy region disposed outside the memory cell array region and the hookup region, the dummy region including dummy word lines, each provided at the same layer as the associated word line.

16 Claims, 13 Drawing Sheets

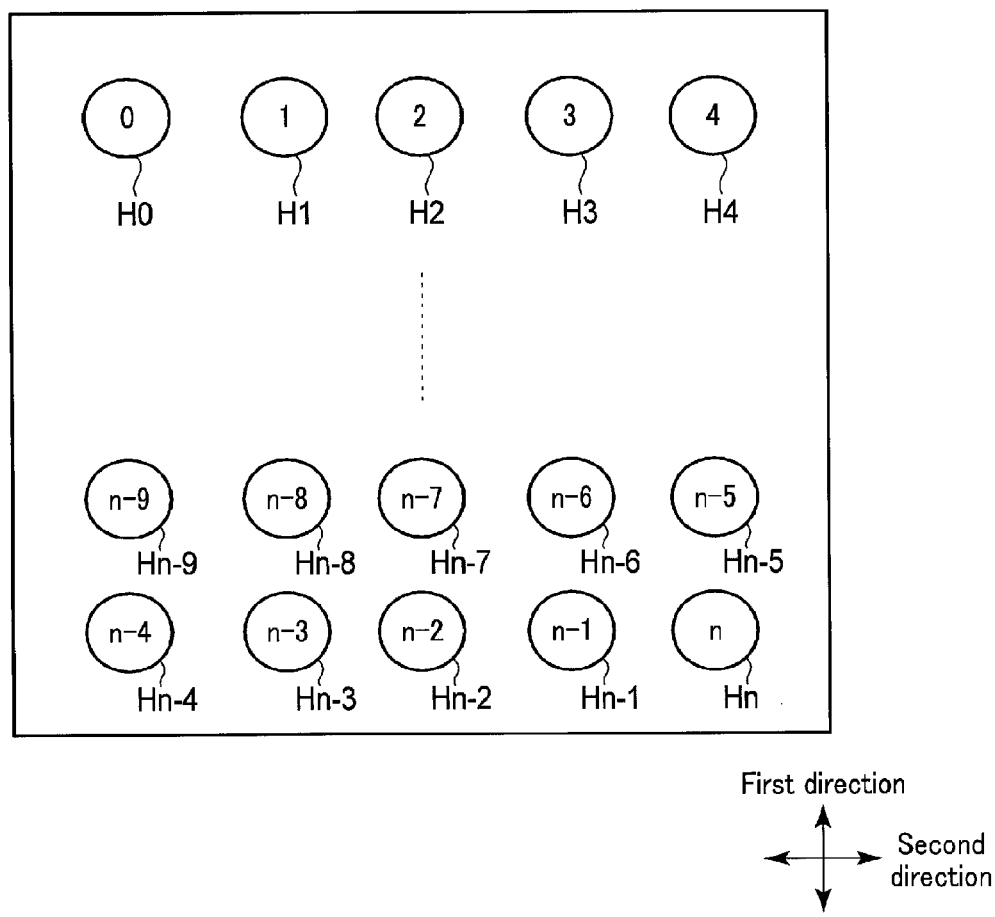
F I G. 5

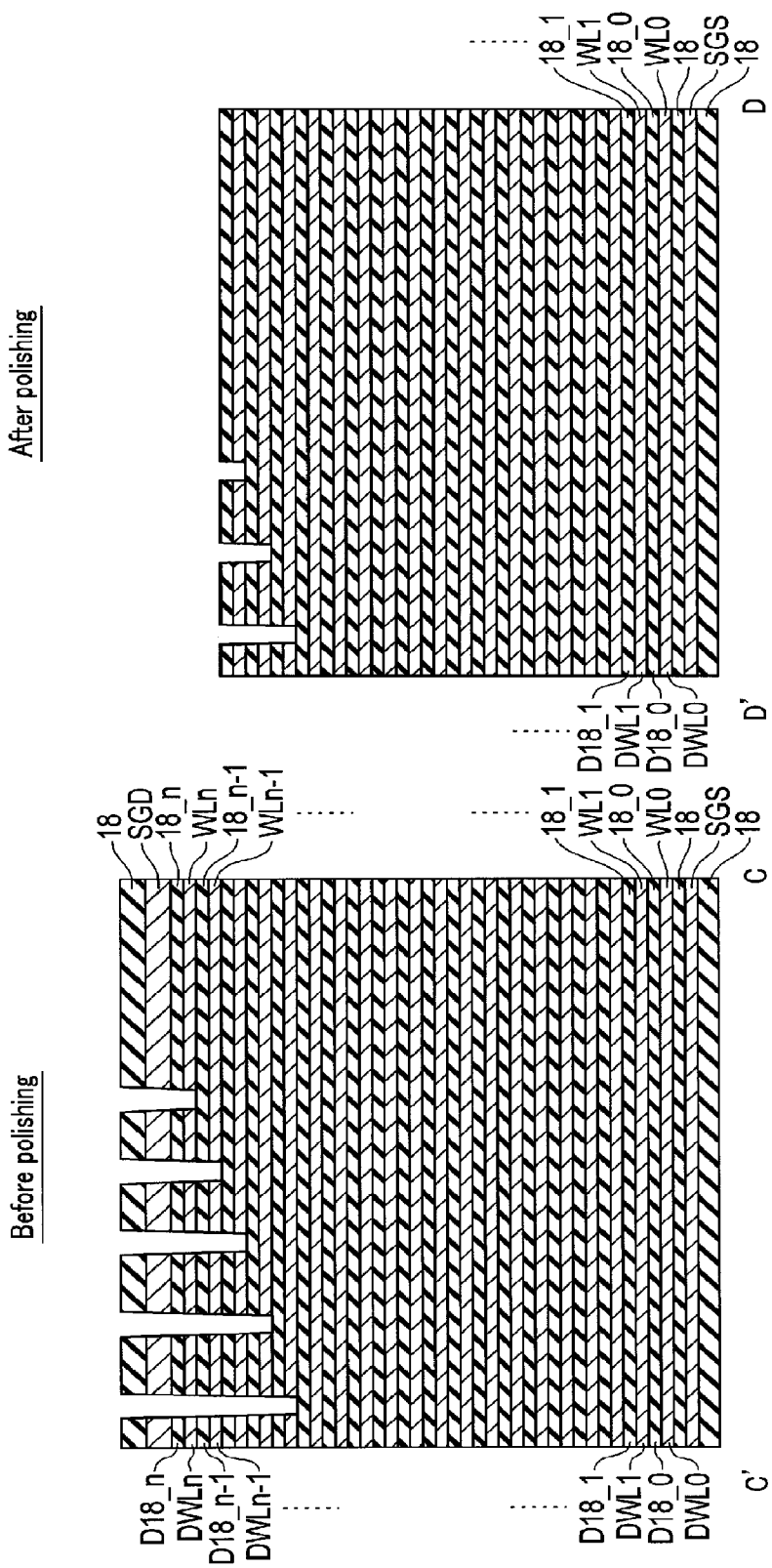
FIG. 8A Before polishing
FIG. 8B After polishing

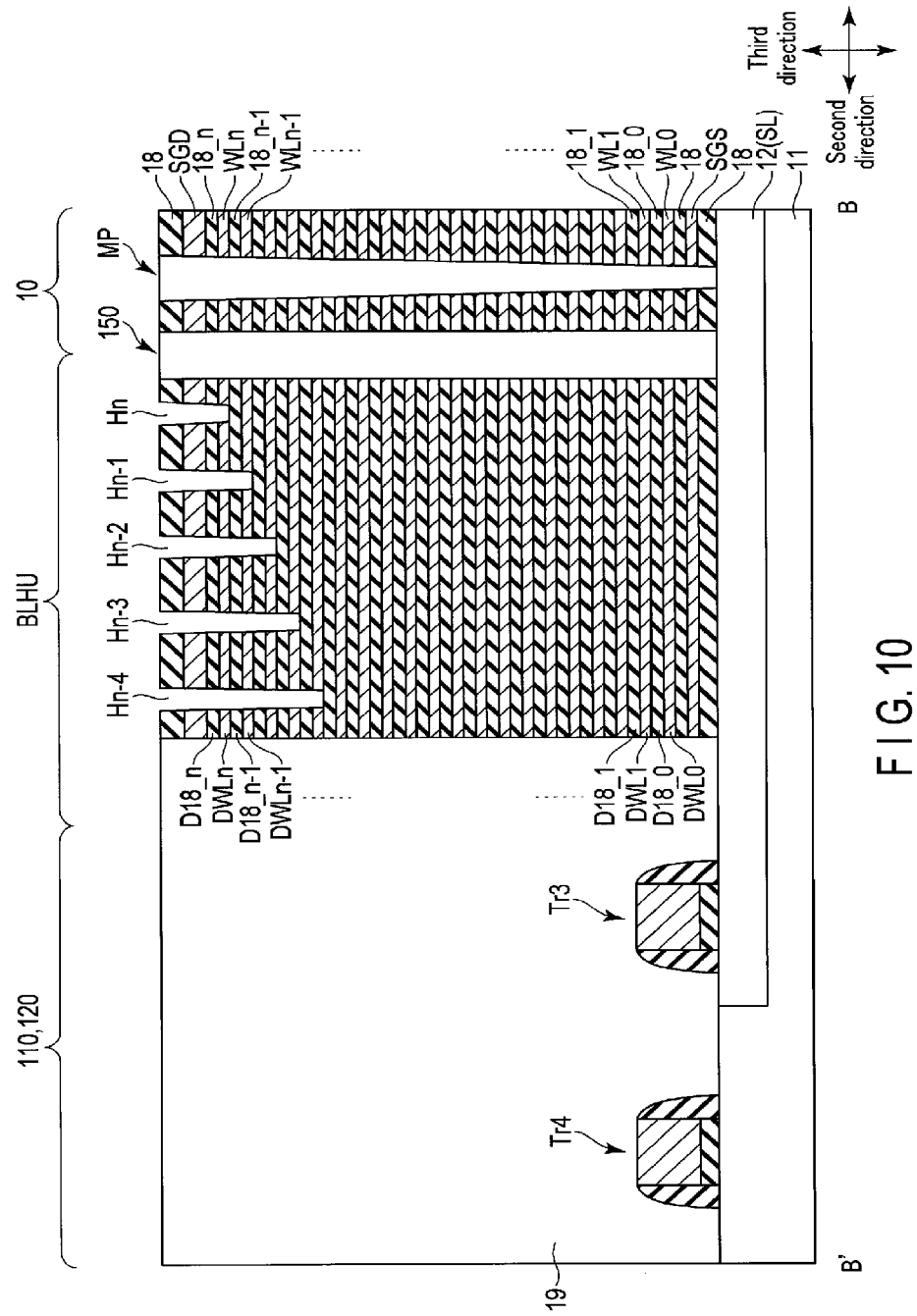
F I G. 10

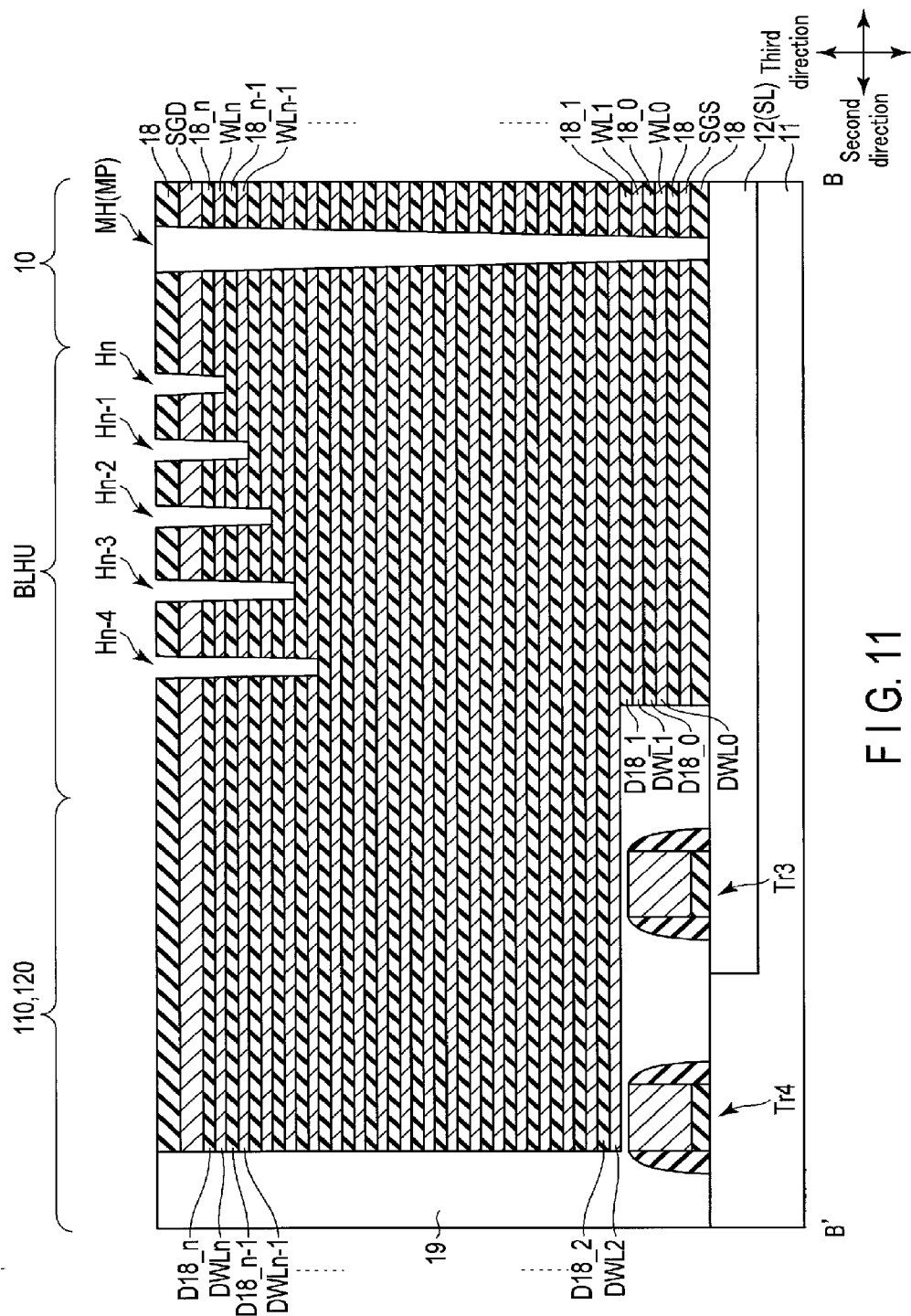
F I G. 11

NONVOLATILE SEMICONDUCTOR MEMORY DEVICE HAVING WORD LINE HOOKUP REGION WITH DUMMY WORD LINES

CROSS REFERENCE TO RELATED APPLICATIONS

This application is based upon and claims the benefit of priority from U.S. Provisional Application No. 62/128,205, filed Mar. 4, 2015, the entire contents of all of which are incorporated herein by reference.

FIELD

This embodiment relates to a nonvolatile semiconductor memory device.

BACKGROUND

As a NAND flash memory, a 3D stacked memory (BiCS: Bit Cost Scalable) is proposed, which is composed of layers that are sequentially stacked, in one process, in the vertical direction on a semiconductor substrate.

BRIEF DESCRIPTION OF THE DRAWING

FIG. 5 is a plan view showing the bit-line hookup region according to the first embodiment;

FIG. 8A is a sectional view taken along line C-C' shown in FIG. 7A;

FIG. 8B is a sectional view taken along line D-D' shown in FIG. 7A;

FIG. 10 is a sectional view taken along line B-B' shown in FIG. 3, and shows a bit-line hookup region according to the modification 2 of the first embodiment;

FIG. 11 is a sectional view taken along line B-B' shown in FIG. 3, and shows a bit-line hookup region according to the modification 3 of the first embodiment;

DETAILED DESCRIPTION

Figure 1:
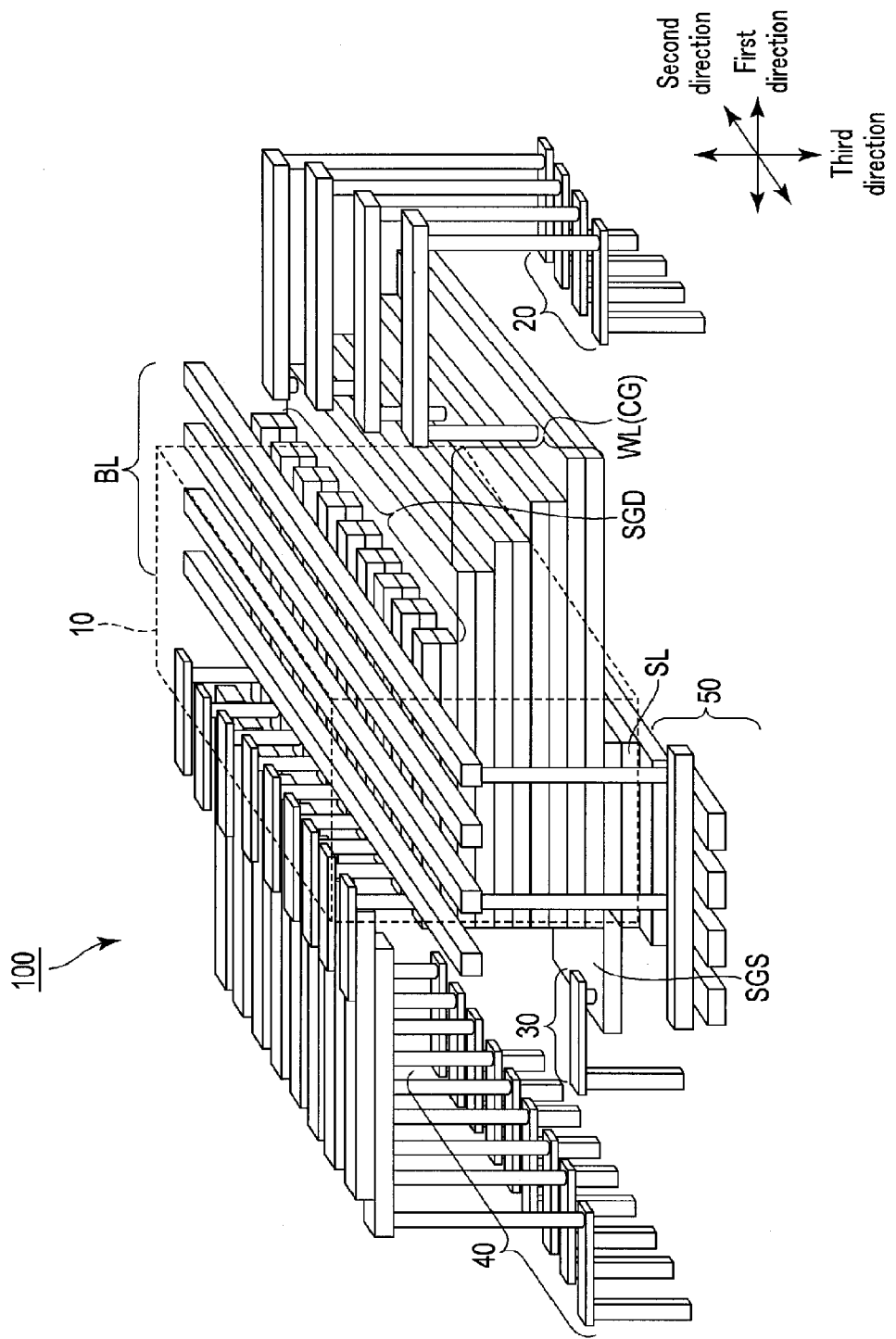
FIG. 1 is a perspective view showing the configuration of a nonvolatile semiconductor memory device according to a first embodiment.

In general, according to one embodiment, a nonvolatile semiconductor memory device includes a memory cell array including a first selection gate, word lines and a second selection gate stacked above a semiconductor substrate, and a memory pillar disposed through the first selection gate, word lines and second selection gate, a hookup region disposed adjacent to the memory cell array region in a first direction, and a dummy region disposed outside the memory cell array region and the hookup region, the dummy region including dummy word lines, each provided at the same layer as the associated word line.

Embodiments of this invention will be described with reference to the accompanying drawings. In the drawings, any components that are identical are designated by the same reference number or symbol, and may be described repeatedly if necessary.

First Embodiment

A nonvolatile semiconductor memory device according to the first embodiment will be described with reference to FIGS. 1, 2, 3, 4, 5, 6, 7A, 7B, 8A, 8B, 9, 10, and 11.

Configuration of the First Embodiment

The configuration of the nonvolatile semiconductor memory device according to the first embodiment will be described with reference to FIGS. 1, 2, 3, 4, 5, and 6.

As shown in FIG. 1, the nonvolatile semiconductor memory device 100 includes a memory-cell array region 10, a word-line driving circuit 20, a source-side selection gate driving circuit 30, a drain-side selection gate driving circuit 40, and a sense amplifier 50. The word-line driving circuit 20, source-side selection gate driving circuit 30, drain-side selection gate driving circuit 40 and sense amplifier 50 are connected by wires to the memory-cell array region 10.

The memory-cell array region 10 has word lines WL, interlayer insulation layers, source-side selection gates SGS, drain-side selection gates SGD, source lines SL and bit lines BL.

Each of the word lines WL and each of the interlayer insulation layers are alternately stacked. As will be described later, memory cell transistors MTr are arranged at the intersections of the word lines WL and semiconductor pillars SP. The semiconductor pillars SP will be described later.

Each word line WL and the interlayer insulation layer existing right on the word line WL make one pair. Pairs of the word lines WL and interlayer insulation layers form a step structure at one end in the first direction (row direction). The lower end of a contact touches the upper surface of the word line WL and is electrically connected to the word line WL. The upper end of the contact is electrically connected to the word-line driving circuit 20 by an upper-layer line. In FIG. 1, four word lines WL are shown, sequentially stacked. The configuration is not limited to this, nonetheless.

The source-side selection gate SGS is provided below the word lines WL. The source-side selection gate SGS is electrically connected to the source-side selection gate driving circuit 30. The source-side selection gate driving circuit 30 drives the source-side selection gate SGS. Below the source-side selection gate SGS, the source lines SL are provided.

The drain-side selection gates SGD are provided above the word lines WL. The drain-side selection gates SGD are electrically connected to the drain-side selection gate driving circuit 40. The drain-side selection gate driving circuit 40 drive the drain-side selection gates SGD. Above the drain-side selection gates SGD, the bit lines BL are provided. The bit lines BL extend in the second direction (column direction). The bit lines BL are electrically connected to the sense amplifier 50.

Figure 2:
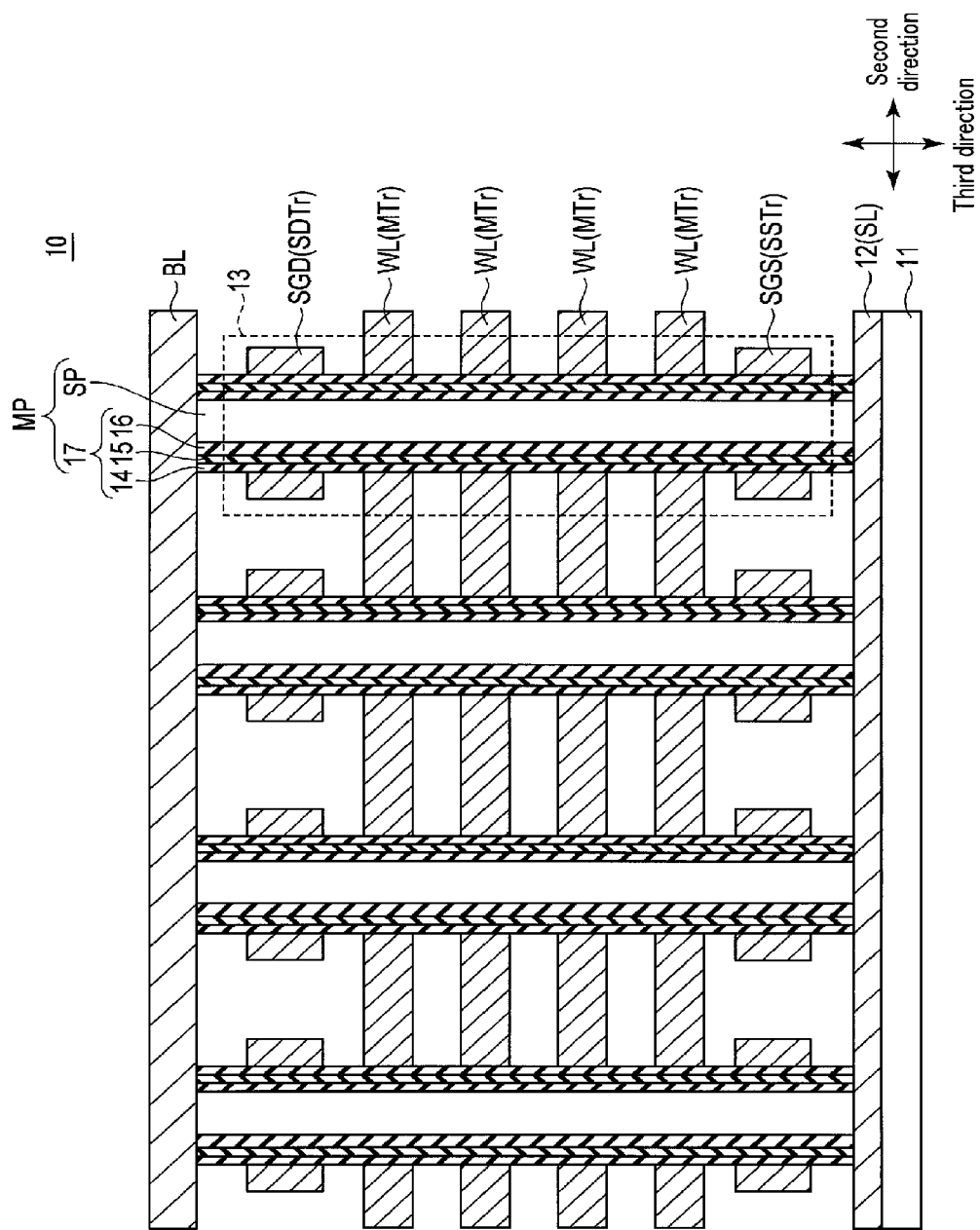
FIG. 2 is a sectional view showing a configuration of the memory-cell array region according to the first embodiment.

As shown in FIG. 2, memory strings 13 are provided above a semiconductor substrate 11 in the memory-cell array region 10. Each memory string 13 includes a source-side selection gate SGS, word lines WL, a drain-side selection gate SGD, and a memory pillar MP. In FIG. 2, the interlayer insulation layers are not illustrated.

The source-side selection gate SGS is provided above the semiconductor substrate 11. The source-side selection gate SGS is composed of an electrically conductive layer such as a dope silicon layer into which impurities (e.g., P) have been injected.

The word lines WL are provided above the source-side selection gate SGS. The word lines WL are stacked, with interlayer insulation layers interposed among them. Each of the word lines WL is composed of a doped silicon layer into which impurities have been injected.

The drain-side selection gate SGD is provided above the word line WL of the uppermost layer. The drain-side selection gate SGD is composed of a doped silicon layer into which impurities have been injected.

The source lines SL are provided below the source-side selection gate SGS. The source lines SL are provided as low-resistance layers 12, on the surface of the semiconductor substrate 11. The bit lines BL are provided above the drain-side selection gate SGD.

The memory pillar MP is provided in the source-side selection gate SGS, word lines WL, drain-side selection gate SGD and interlayer insulation layers. The memory pillar MP is electrically connected, at the lower end, to one source line, and at the upper end, to one bit line BL. The memory pillar MP has a memory film 17 and a semiconductor pillar SP.

The semiconductor pillar SP functions as the channel of the memory string 13.

The memory film 17 includes a block insulation layer 14, a charge storage layer 15, and a tunnel insulation layer 16, and is provided to surround the memory pillar MP.

The block insulation layer 14 is provided to surround the memory pillar MP. The block insulation layer 14 is composed of an insulation layer of, for example, silicon oxide or silicon nitride, or composed of such insulation layers laid on each other.

The charge storage layer 15 is provided to surround the block insulation layer 14. The charge storage layer 15 is composed of an insulation layer of, for example, silicon oxide or silicon nitride, or composed of such insulation layers laid on each other.

The tunnel insulation layer 16 is provided to surround the charge storage layer 15. The tunnel insulation layer 16 is composed of an insulation layer of, for example, silicon oxide or silicon nitride.

The word lines WL and the interlayer insulation layers, sequentially stacked, are formed to surround the memory pillar MP.

The memory pillars MP and various gates constitute various transistors. More specifically, a word line WL and a memory pillar MP constitute a memory cell transistor MTr. A source-side selection gate SGS and a memory pillar MP constitute a source-side selection transistor SSTr. A drain-side selection gate SGD and a memory pillar MP constitute a drain-side selection transistor SDTr.

The configuration of the memory cell array is described in, for example, U.S. patent application Ser. No. 12/407,403 filed Mar. 19, 2009 and entitled "3D Stacked Nonvolatile Semiconductor Memory," and also in U.S. patent application Ser. No. 12/406,524 filed Mar. 18, 2009 and entitled "3D Stacked Nonvolatile Semiconductor Memory." The entire contents of these patent applications are incorporated herein by reference.

Figure 3:
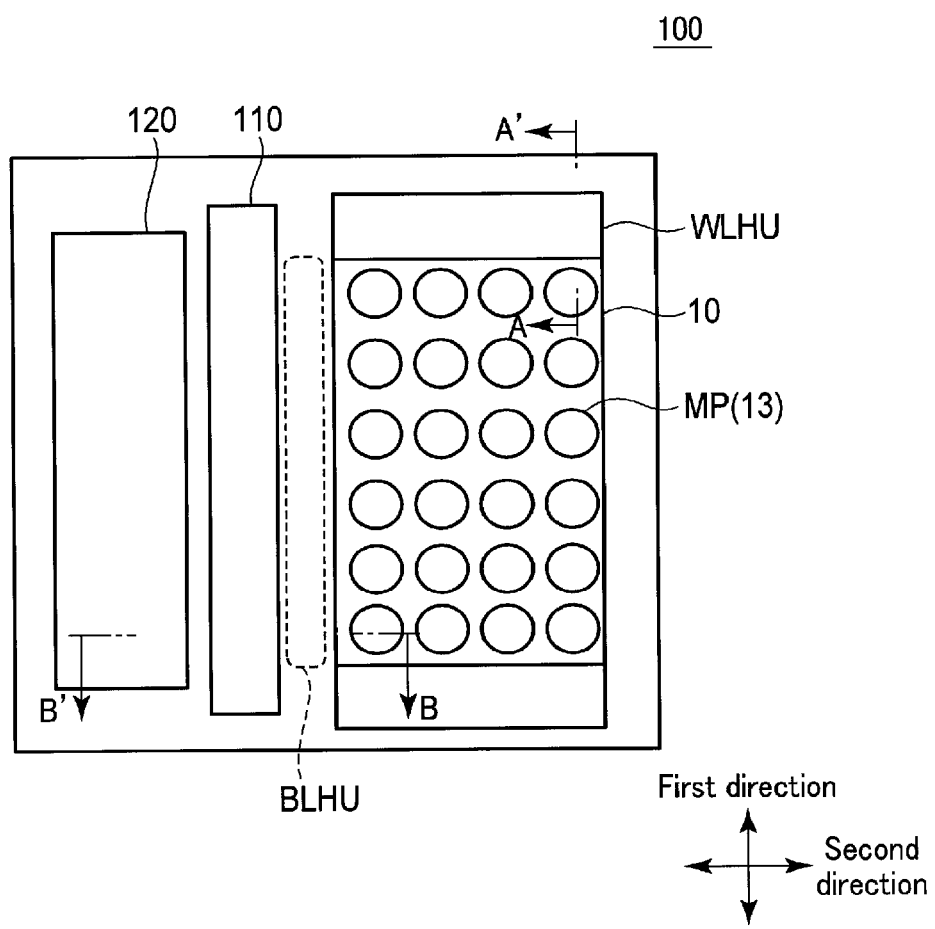
FIG. 3 is a plan view showing the layout of the nonvolatile semiconductor memory device according to the first embodiment.

As shown in FIG. 3, the nonvolatile semiconductor memory device 100 (semiconductor chip) includes a memory-cell array region 10, a word-line hookup region WLHU, a bit-line hookup region BLHU, a sense amplifier region 110, and a peripheral circuit region 120.

The memory-cell array region 10 includes memory strings 13. The memory strings 13 are arranged in the form of a matrix.

The word-line hookup region WLHU is provided to be adjacent to the memory-cell array region 10 in the first direction. The word-line hookup region WLHU is a wiring region. This wiring region has contacts and upper lines, and electrically connects the word lines WL to an external circuit (word-line driving circuit 20).

Figure 4:
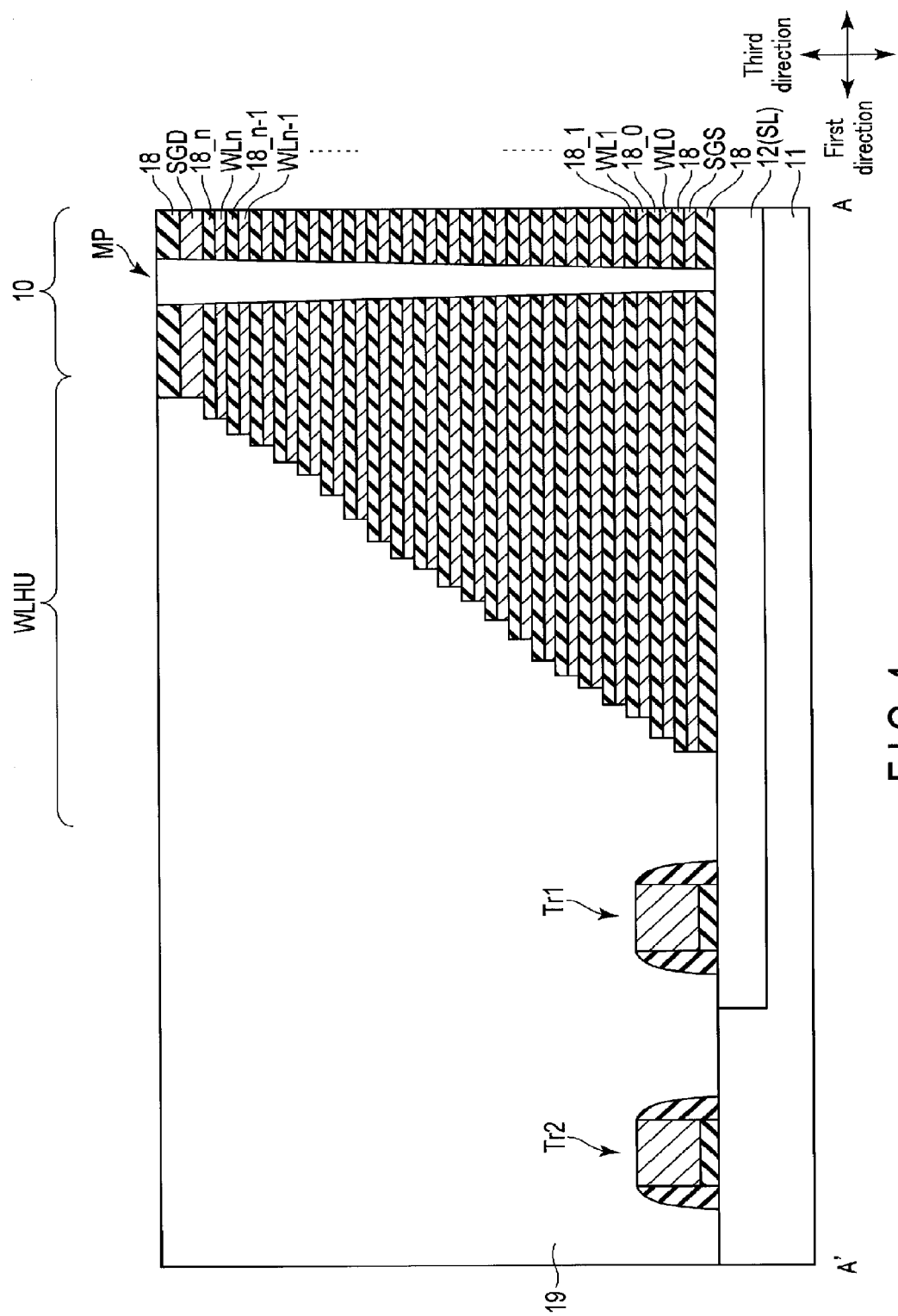
FIG. 4 is a sectional view taken along line A-A' shown in FIG. 3, and shows a word-line hookup region according to the first embodiment.
Figure 6:
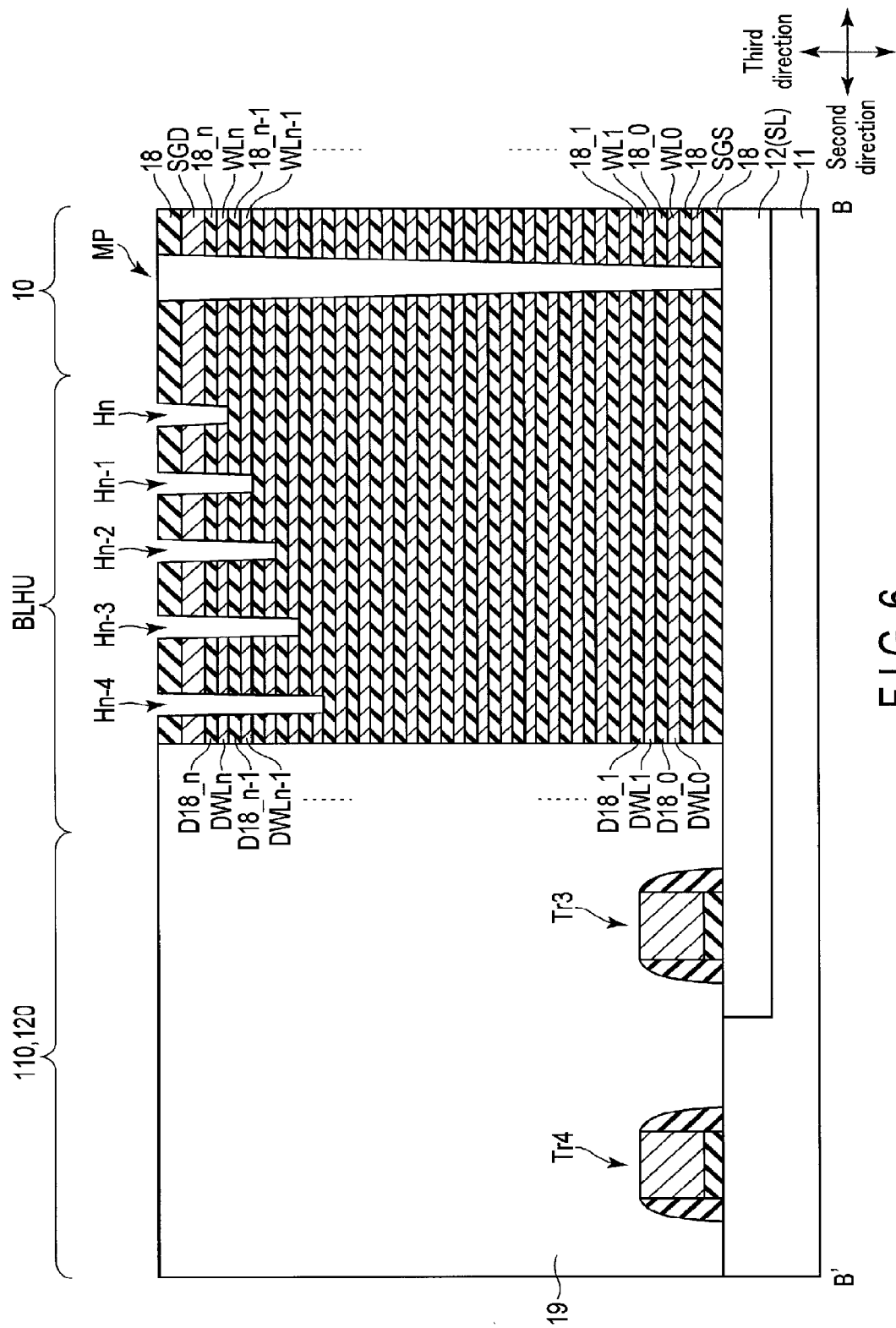
FIG. 6 is a sectional view taken along line B-B' shown in FIG. 3, and shows a bit-line hookup region according to the first embodiment.

FIGS. 4, 5, and 6 show the case where n word lines WL0 to WLn, n dummy word lines DWL0 to DWLn, n interlayer insulation layers 18_0 to 18_n and n dummy interlayer insulation layers D18_0 to D18_n are stacked. In the following description, the n word lines WL0 to WLn, n dummy word lines DWL0 to DWLn, n interlayer insulation layers 18_0 to 18_n and n dummy interlayer insulation layers D18_0 to D18_n will be referred to, generally as "word lines WL," "dummy word lines DWL," "interlayer insulation layers 18" and "dummy interlayer insulation layers D18," unless these components need to be distinguished one from another.

As shown in FIG. 4, in the word-line hookup region WLHU, the n word lines WL0 to WLn and the n interlayer insulation layers 18_0 to 18_n are alternately stacked. Any word line WL (e.g., word line WL0) and the interlayer insulation layer 18 (e.g., interlayer insulation layer 18_0) provided immediately on the word line WL have ends that are located at the substantially identical position. Assuming that the word line WL and the interlayer insulation layer 18 make one pair, n pairs of the word lines WL and the interlayer insulation layers 18 form a step structure. The ends of the interlayer insulation layers 18_0 to 18_n are therefore exposed at the upper surface. The interlayer insulation layers 18_0 to 18_n so exposed electrically connect contacts (not shown) to the word lines WL0 to WLn, respectively. Around the word-line hookup region WLHU, transistors Tr1 and Tr2 are arranged on the same layer as the word lines WL (i.e., word lines WL0 to WL1 in this case) provided on the lower layer.

Referring to FIG. 3 again, the bit-line hookup region BLHU is provided to be adjacent to the memory-cell array region 10 in the second direction. The bit-line hookup region BLHU is a wiring region. This wiring region has contacts and electrically connects the bit lines BL to the sense amplifier 50.

The sense amplifier region 110 is provided, adjacent to the bit-line hookup region BLHU in the second direction, on the side opposite to the memory-cell array region 10. The sense amplifier region 110 is the region in which the sense amplifier 50 is provided.

The peripheral circuit region 120 is provided on the side opposite to the bit-line hookup region BLHU in the second direction, with respect to the sense amplifier region 110. The peripheral circuit region 120 is a region in which peripheral circuits (not shown) are provided.

As shown on FIG. 5 and FIG. 6, in the word-line hookup region WLHU the n dummy word lines DWL0 to DWLn and the n dummy interlayer insulation layers D18_0 to D18_n are alternately stacked. Further, each of the n dummy word lines DWL0 to DWLn and each of the n dummy interlayer insulation layers D18_0 to D18_n have ends located at the substantially identical position.

The n dummy word lines DWL0 to DWLn and the n dummy interlayer insulation layers D18_0 to D18_n are integral with (or continuous to) the word lines WL0 to WLn and n interlayer insulation layers 18_0 to 18_n, and exist on the same layer.

In the n dummy word lines DWL0 to DWLn and n dummy interlayer insulation layers D18.0 to D18_n, n patterns H0 to Hn are provided. More precisely, the pattern H0 extends from above to the dummy word line DWL0, and the pattern H1 extends from above to the dummy word line DWL1. The patterns H2 to Hn-2 extend in a similar manner. The pattern Hn-1 extends from above to the dummy word line DWLn-1. The pattern Hn extends from above to the dummy word line DWLn. The pattern H0 does not extend to the selection gate on the source-line side. The pattern H1 does not extend to the dummy word line DWL0. The patterns H2 to Hn-2 do not extend to the associated dummy word lines. The pattern Hn-1 does not extend to the dummy word line DWLn-2. The pattern Hn does not extend to the dummy word line DWLn-1.

The n patterns H0 to Hn are arranged in, for example, a matrix pattern. The arrangement is not limited to this, nonetheless. As will be described later, on which layer any word line WL subjected to the failure analysis is provided can be determined from the n patterns H0 to Hn.

The n patterns H0 to Hn are formed by means of etching, at the same time the step structure is formed in the word-line hookup region WLHU. More precisely, the pattern H0 is formed in the bit-line hookup region BLHU when the etching proceeds to the word line WL0 in the word-line hookup region WLHU. Similarly, the pattern H1 is formed at the same time the word line WL1 is etched. The patterns H2 to Hn-2 are formed in the same way. The pattern Hn-1 is formed at the same time the word line WLn-1 is etched. The pattern Hn is formed at the same time the word line WLn is etched.

The patterns H0 to Hn may be either voids or filled with an insulating material or the like.

The sense amplifier region 110 and peripheral circuit region 120 have the sense amplifier 50 and a peripheral circuit (i.e., transistors Tr3 and Tr4), respectively, on the same layer as the dummy word lines DLW lower side (i.e., dummy word lines DWL0 and DWL1 in this case). The transistors Tr3 and Tr4 are covered with an insulation layer 19.

Failure Analysis in the First Embodiment

The failure analysis performed on the nonvolatile semiconductor memory device according to the first embodiment will be explained with reference to FIGS. 7A, 7B, 8A and 8B.

In the failure analysis of the word lines WL0 to WLn, the word lines WL0 to WLn are polished from above by means of, for example, chemical mechanical polishing (CMP). Any word line WL to be analyzed for failure is exposed and then subjected to the failure analysis. At this point, the word line WL must be identified by determining in which layer it lies. Therefore, the failure analysis is performed in the first embodiment, as follows.

Figure 7B:
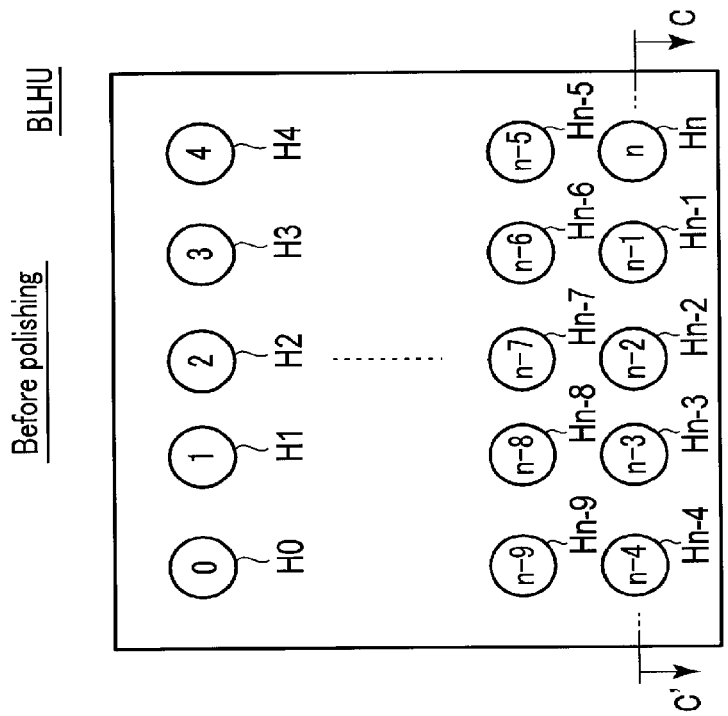
FIG. 7B is a plan view showing the bit-line hookup region BLHU polished in the failure analysis.
Figure 7A:
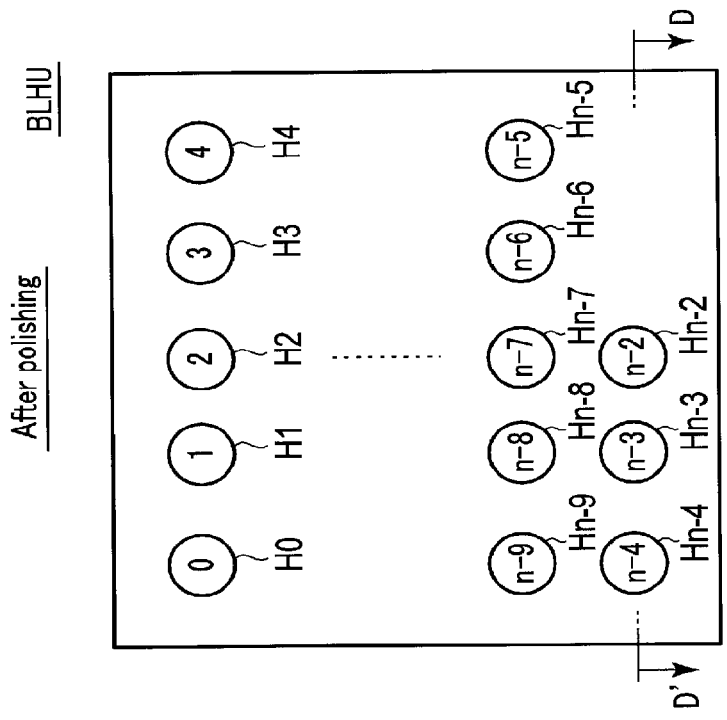
FIG. 7A is a plan view showing a bit-line hookup region BLHU not polished in the failure analysis.

As shown in FIGS. 7A and 8A, the n dummy word lines DWL0 to DWLn have n patterns H0 to Hn, respectively, reaching each layer, before the polishing is performed in the failure analysis. Thereafter, the word lines WL0 to WLn are polished from above (the word line WLn is polished first). At the same time, the dummy word lines DWL0 to DWLn are polished. Then, as shown in FIGS. 7B and 8B, the patterns Hn to Hn-1, for example, are removed after the polishing for failure analysis has been performed. If the patterns Hn to Hn-1 are so removed, it is confirmed that the dummy word lines DWLn to DWLn-1 and, hence, the word lines WLn to WLn-1 have been polished. That is, the word line WLn-2 is considered as an object of the failure analysis. Thus, any one of the word lines WL0 to WLn to analyze for failure can be easily specified in accordance with the presence or absence of the patterns H0 to Hn.

Advantages of the First Embodiment

To perform the failure analysis on the n word lines WL0 to WLn, the n word lines WL0 to WLn are polished from the uppermost word line first. Any word line that should be analyzed for failure is exposed and is thereby subjected to the failure analysis. At this point, which layer the exposed word line WL pertains to must be determined, thereby specifying the word line (line WL0, WL1, or WLn) to analyze for failure. The exposed word line WL is identified by confirming the step structure in the word-line hookup region WLHU. However, the degree of polishing differs from one region to another (that is, the polishing is not uniform). The exposed word line WL in the word-line hookup region WLHU inevitably differs from the exposed word line WL in any other region. Consequently, it is difficult to determine which layer the exposed word line WL pertains to in any region other than the word-line hookup region WLHU.

In the first embodiment described above, however, the bit-line hookup region BLHU, for example, includes dummy word lines DWL and patterns H reaching each dummy word line DWL. The dummy word lines DWL are provided on the same layer as the word lines WL. Whether each dummy word line DWL has a pattern H is determined after the word line has been polished to undergo the failure analysis. It is therefore easy to determine which layer the word line polished pertains to. Hence, it can be easily determined which layer the word line to analyze for failure pertains to.

In the first embodiment, the dummy word lines DWL identical to the word lines WL in structure are provided in the bit-line hookup region BLHU. This controls the dishing forming in the bit-line hookup region BLHU while any word line WL is being polished.

Further, in first embodiment, the dummy word lines DWL provided in the bit-line hookup region BLHU are smaller than the dummy word lines DWL provided in the word-line hookup region WLHU. This is because in the I-type BiCS of this embodiment, the word lines WL exist along with the peripheral transistors Tr in a lower layer, and the region in which to form dummy word lines DWL is inevitably limited. That is, since the dummy word lines DWL are small, they can be well arranged in a limited region.

In the first embodiment, the n patterns H0 to Hn are simultaneously formed by etching when the step structure is formed in the word-line hookup region WLHU. A manufacturing process need not be added to form the n patterns H0 to Hn.

Modifications of the First Embodiment

Modifications of the nonvolatile semiconductor memory device according to the first embodiment will be described with reference to FIGS. 9, 10, and 11.

Figure 9:
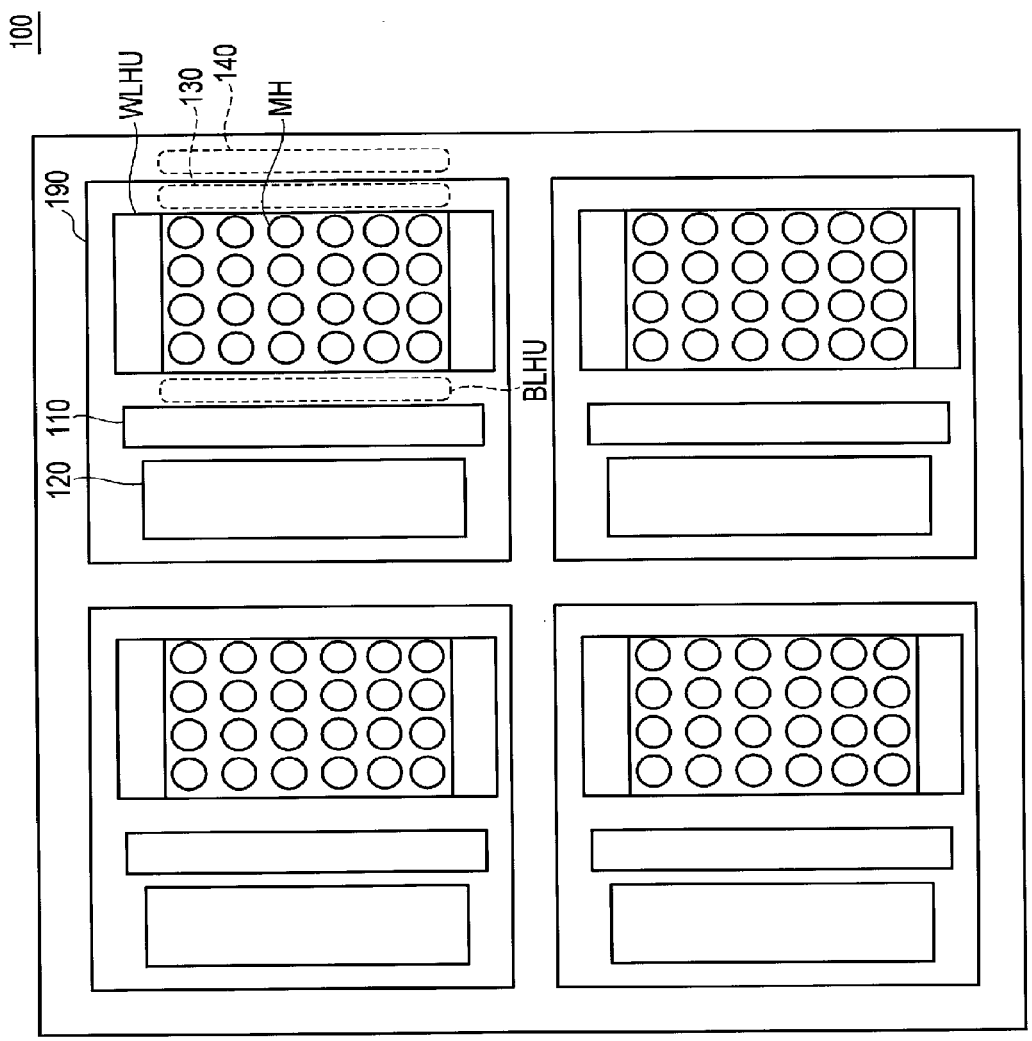
FIG. 9 is a plan view showing the layout of a nonvolatile semiconductor memory device according to the modification 1 of the first embodiment.

FIG. 9 shows semiconductor chips 190 before the dicing process.

As seen from FIG. 9, a modification 1 differs from the first embodiment in that the nonvolatile semiconductor memory device 100 has a peripheral region 130 and a scribe region 140. The dummy word lines DWLn and DWLn-1 and the dummy interlayer insulation layers $D18\_0$ to $D18\_n$ are provided in the peripheral region 130 and/or scribe region 140. Patterns H0 to Hn are therefore provided in the peripheral region 130 and/or scribe region 140. The peripheral region 130 is provided adjacent to the scribe region 140 and outside the bit-line hookup region BLHU. The scribe region 140 is a dicing line. As in the first embodiment, the patterns H0 to Hn may be provided also in the bit-line hookup region BLHU.

The dummy word lines DWLn and DWLn-1 are thus arranged in the bit-line hookup region BLHU, peripheral region 130 and scribe region 140. Any word line WL to analyze for failure can therefore be specified in each region.

As seen from FIG. 10, a modification 2 differs from the first embodiment in that the n dummy word lines DWL0 to DWLn are discontinuous from the n word lines WL0 to WLn, and that the n interlayer insulation layers $D18\_0$ to $D18\_n$ are discontinuous from the interlayer insulation layers $D18\_0$ to $D18\_n$. These lines DWL0 to DWLn and $D18\_0$ to $D18\_n$ are isolated, one from another, by slit 150. The slit 150 may be void or filled with an insulating material.

As seen from FIG. 11, a modification 3 differs from the first embodiment in that the dummy word lines DWL (i.e., dummy word lines DWL2 to DWLn in this case) extend from the bit-line hookup region BLHU to the sense amplifier region 110 and peripheral circuit region 120. That is, the dummy word lines DWL2 to DWLn are positioned above the transistors Tr3 and Tr4, and the dummy word lines DWL0 and DWL1 are provided in the bit-line hookup region BLHU only.

Second Embodiment

A nonvolatile semiconductor memory device according to the second embodiment will be described with reference to FIG. 12 and FIG. 13.

The components of the second embodiment, which are similar to those of the first embodiment, will not be described. The components different from those of the first embodiment will be described in the main.

Configuration of the First Embodiment

The configuration of a nonvolatile semiconductor memory device according to the second embodiment will be described with reference to FIG. 12.

Figure 12:
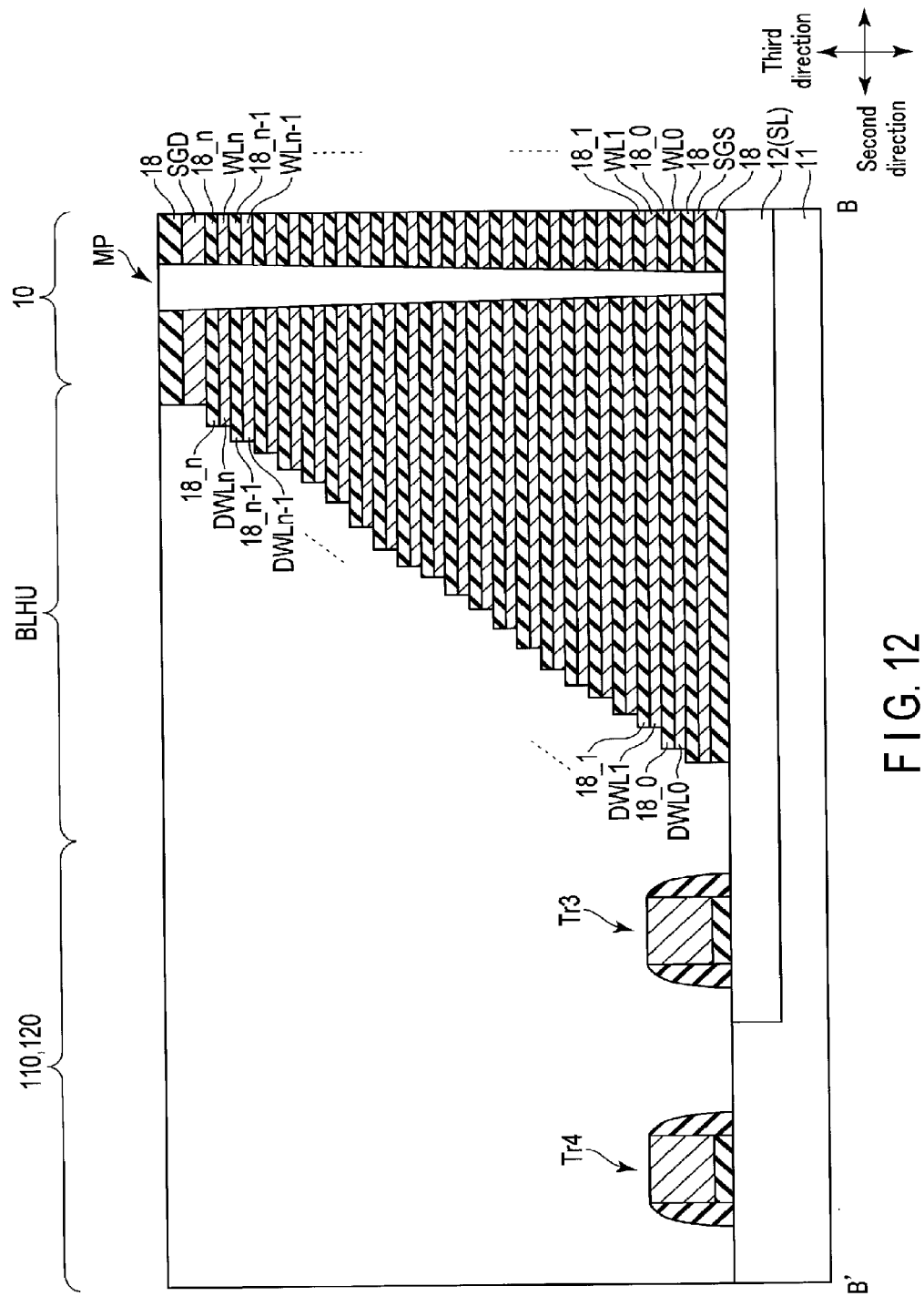
FIG. 12 is a sectional view taken along line B-B' shown in FIG. 3, and shows a bit-line hookup region according to the second embodiment.

As seen from FIG. 12, the second embodiment differs from the first embodiment in that the dummy word lines DWL0 to DWLn have a step structure, in the bit-line hookup region BLHU.

In the bit-line hookup region BLHU, the n dummy word lines DWL0 to DWLn and the n dummy interlayer insulation layers $D18\_0$ to $D18\_n$ are alternately stacked. Any dummy word line DWL (e.g., dummy word line DWL0) and the dummy interlayer insulation layer (e.g., dummy interlayer insulation layer $D18\_0$) immediately above the dummy word line DWL have ends at the same position. Assuming that the dummy word line DWL and the dummy interlayer insulation layer D18 make one pair, n pairs of the dummy word lines DWL and the dummy interlayer insulation layers D18 form step structure. Pairs of the dummy word line DWL and the dummy interlayer insulation layer D18 have step. This step structure specifies which layer pertains to the word line WL that should be analyzed in the failure analysis.

The step structures of the dummy word lines DWL0 to DWLn have a width smaller than that of the step structures of the word lines WL0 to WLn. This is because no contact need be connected to the step structures of the dummy word lines DWL0 to DWLn. That is, the step structures of the dummy word lines DWL0 to DWLn are used only to determine which layer pertains to the word line WL that should be analyzed in the failure analysis.

The n dummy word lines DWL0 to DWLn and n dummy interlayer insulation layer $D18\_0$ to $D18\_n$ are continuous to the n word lines WL0 to WLn and n interlayer insulation layers $D18\_0$ to D18, respectively, each existing in the same layer as the associated word line or in the same layer as the associated interlayer insulation layer.

The step structures in the bit-line hookup region BLHU are formed by etching, at the same time step structures are formed in the word-line hookup region WLHU. To be more specific, as the etching proceeds to the word line WL0 in the word-line hookup region WLHU, the dummy word line DWL0 is etched in the bit-line hookup region BLHU. Similarly, the dummy word line DWL1 is etched at the same time the word line WL1 is etched, and the other dummy word lines are etched in a similar manner. Namely, the dummy word line DWLn-1 is etched at the same time as the word line WLn-1, and the dummy word line DWLn is etched at the same time as the word line WLn.

Failure Analysis in the Second Embodiment

In the polishing before the failure analysis, the n dummy word lines DWL0 to DWLn have a step each, for the layer. Thereafter, the dummy word lines DWL0 to DWL are polished at the same time the word lines WL0 to WLn are sequentially polished from the uppermost. As a result, the dummy word lines DWLn and DWLn-1, for example, are removed. At this point, the position of the step (i.e., end) of the dummy word line DWLn-2 is determined, thereby confirming that the polishing has proceeded to the dummy word lines DWLn and DWLn-1, and also to the word lines WLn and WLn-1. It is therefore determined that the work line WLn-2 should be analyzed for failure. Thus, any one of the word lines WL0 to WLn, which should be analyzed for failure, can be easily determined, by confirming the step structures of the dummy word lines DWL0 to DWLn.

Advantages of the Second Embodiment

In the second embodiment described above, the bit-line hookup region BLHU, for example, includes dummy word lines DWL having a step structure. The dummy word lines DWL are provided at the same layer as the word line WL are provided in the memory-cell array region 10. The step structure of dummy word line DWL is confirmed after the word lines WL have been polished in order to perform the failure analysis on the word lines WL. The second embodiment can therefore achieve the same advantage as the first embodiment.

Modification of the Second Embodiment

A modification of the second embodiment will be described, with reference to FIG. 13.

Figure 13:
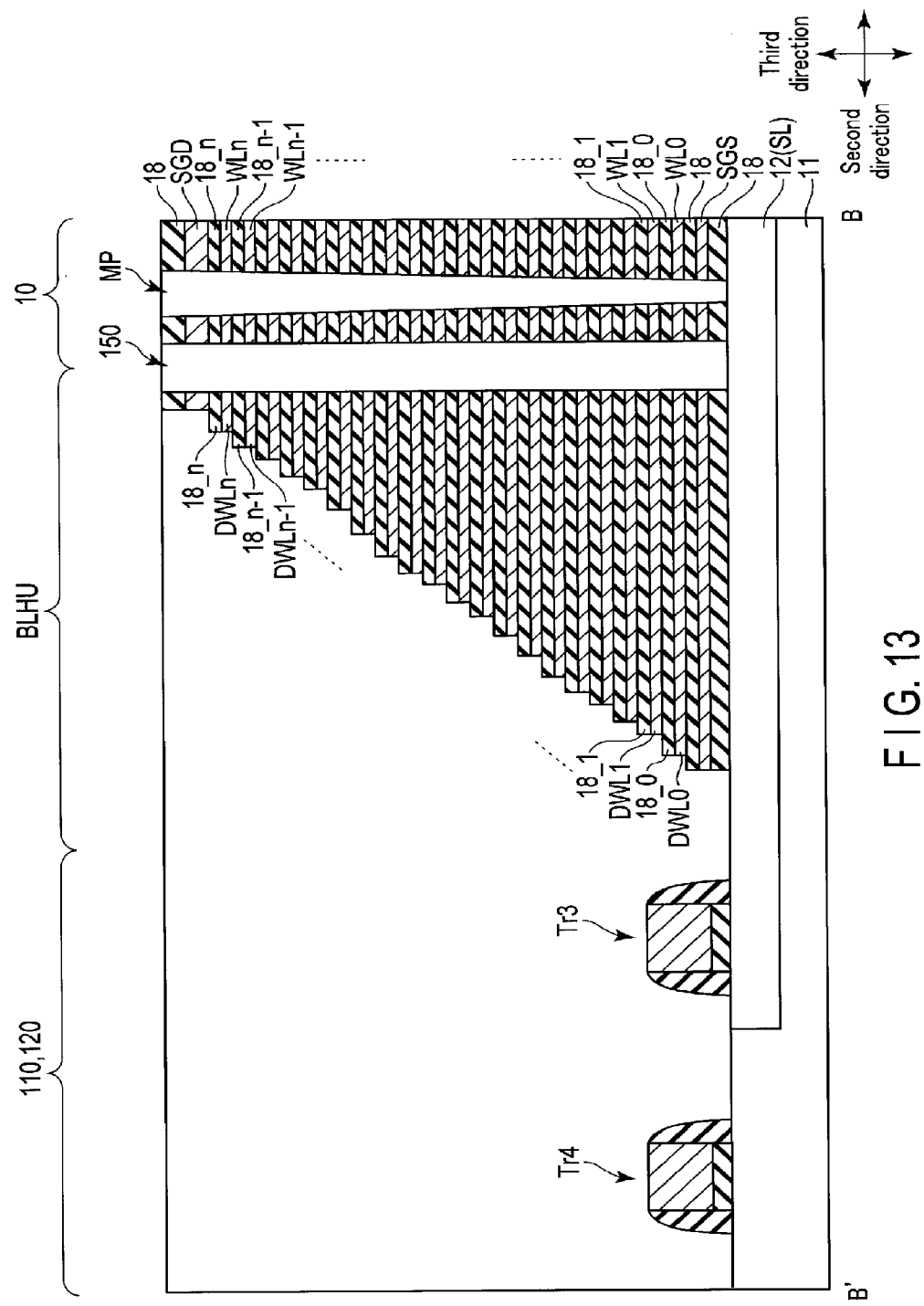
FIG. 13 is a sectional view taken along line B-B' shown in FIG. 3, and shows a bit-line hookup region according to a modification of the second embodiment.

As seen from FIG. 13, the modification differs from the second embodiment in that the n dummy word lines DWL0 to DWLn and n dummy interlayer insulation layers D18_0 to D18_$n$ are discontinuous from the n word lines WL0 to WLn and n interlayer insulation layers D18_0 to D18, respectively, each existing in the same layer as the associated word line or in the same layer as the associated interlayer insulation layer. The dummy word lines and dummy interlayer insulation layer are isolated, one from another, by slit 150. The slit 150 may be void or filled with an insulating material.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a memory cell array region including a first selection gate, word lines and a second selection gate stacked above a semiconductor substrate, and a memory pillar disposed through the first selection gate, word lines and second selection gate;
   a hookup region disposed adjacent to the memory cell array region in a first direction; and
   a dummy region disposed outside the memory cell array region and the hookup region, the dummy region including dummy word lines, each provided at the same layer as the associated word line,
   wherein the dummy region includes patterns each extending from an upper surface to each of the dummy word lines.

2. The device of claim 1, wherein a length of a first dummy word line in a second direction orthogonal to the first direction is larger than a length of a second dummy word line above the first dummy word line in the second direction.

3. The device of claim 1, wherein the dummy region is a bit-line hookup region.

4. The device of claim 1, wherein the dummy region is a peripheral region.

5. The device of claim 1, wherein the dummy region is a scribe region.

6. The device of claim 1, wherein the dummy word lines are continuous to the word lines.

7. The device of claim 1, wherein the dummy word lines are discontinuous from the word lines.

8. The device of claim 1, wherein the dummy region is disposed adjacent to the memory cell array in a second direction orthogonal to the first direction.

9. A nonvolatile semiconductor memory device comprising:
   a memory cell array region including a first selection gate, word lines and a second selection gate and a memory pillar disposed through the first selection gate, word lines and second selection gate;
   a hookup region disposed adjacent to the memory cell array region in a first direction; and
   a dummy region disposed outside the memory-cell array region and the hookup region, the dummy region including dummy word lines, each provided at the same layer as the associated word line,
   wherein the dummy region includes patterns each extending from an upper surface to each of the dummy word lines.

10. The device of claim 9, wherein the dummy region is a bit-line hookup region.

11. The device of claim 9, wherein the dummy region is a peripheral region.

12. The device of claim 9, wherein the dummy region is a scribe region.

13. The device of claim 9, wherein the dummy word lines are continuous to the word lines.

14. The device of claim 9, wherein the dummy word lines are discontinuous from the word lines.

15. The device of claim 9, wherein the dummy region is disposed adjacent to the memory cell array in a second direction orthogonal to the first direction.

16. A nonvolatile semiconductor memory device comprising:
   a memory cell array region including a first selection gate, word lines and a second selection gate and a memory pillar disposed through the first selection gate, word lines and second selection gate;
   a hookup region disposed adjacent to the memory cell array region in a first direction; and
   a dummy region disposed outside the memory-cell array region and the hookup region, the dummy region including dummy word lines, each provided at the same layer as the associated word line,
   wherein a length of a first dummy word line in a second direction orthogonal to the first direction is larger than a length of a second dummy word line above the first dummy word line in the second direction.

* * * * *